(12) United States Patent
Moon et al.

(10) Patent No.: US 10,403,446 B2
(45) Date of Patent: Sep. 3, 2019

(54) DYE-SENSITIZED SOLAR CELL INCLUDING POLYMER/GRAPHENE COMPOSITE GEL ELECTROLYTE AND METHODS OF PREPARING THE SAME

(71) Applicant: SOGANG UNIVERSITY RESEARCH FOUNDATION, Seoul (KR)

(72) Inventors: Jun Hyuk Moon, Seoul (KR); Yu-il Kang, Seoul (KR); Su Jin Ha, Seoul (KR)

(73) Assignee: Sogang University Research Foundation, Seoul (KR)

( * ) Notice: Subject to any disclaimer, the term of this patent is extended or adjusted under 35 U.S.C. 154(b) by 241 days.

(21) Appl. No.: 15/423,462

(22) Filed: Feb. 2, 2017

(65) Prior Publication Data

US 2017/0229251 A1  Aug. 10, 2017

(30) Foreign Application Priority Data

Feb. 5, 2016  (KR) .................... 10-2016-0014788

(51) Int. Cl.
*H01G 9/20* (2006.01)
*H01L 51/42* (2006.01)
*H01L 51/00* (2006.01)
*H01G 9/00* (2006.01)

(52) U.S. Cl.
CPC ......... *H01G 9/2059* (2013.01); *H01G 9/0036* (2013.01); *H01G 9/2009* (2013.01); *H01G 9/2022* (2013.01); *H01L 51/0003* (2013.01); *H01L 51/4253* (2013.01); *H01G 9/2031* (2013.01); *Y02E 10/542* (2013.01)

(58) Field of Classification Search
CPC .. H01G 9/2059; H01G 9/0036; H01G 9/2009; H01L 51/4253; H01L 51/0003
See application file for complete search history.

(56) References Cited

U.S. PATENT DOCUMENTS

2015/0144199 A1* 5/2015 Huh ............... H01G 9/2031
136/263

FOREIGN PATENT DOCUMENTS

| KR | 10-2013-0132301 A | 12/2013 |
|---|---|---|
| KR | 10-2013-0139450 A | 12/2013 |
| KR | 10-2015-006171 A | 6/2015 |

OTHER PUBLICATIONS

Bi et al., "High efficiency and stability of quasi solid state dye sensitized solar cells using graphene incorporated soluble polystyrene gel electrolytes", Journal of Power Sources, 2014.*
Yuan et al., "Efficient quasi-solid-state dye-sensitized solar cells from graphene incorporated conducting gel electrolytes" Journal of Materials Chemistry A 2014.*
Kang, Yu-il, et al., "In situ Poly(methyl methacrylate)/Graphene Composite Gel Electrolytes for Highly Stable Dye-Sensitized Solar Cells", ChemSusChem, vol. 8, Oct. 16, 2015, pp. 3799-3804.

* cited by examiner

Primary Examiner — Matthew T Martin

(57) ABSTRACT

Disclosed are a dye-sensitized solar cell including a polymer/graphene composite gel electrolyte and methods of preparing the dye-sensitized solar cell.

8 Claims, 8 Drawing Sheets

DYE-SENSITIZED SOLAR CELL INCLUDING POLYMER/GRAPHENE COMPOSITE GEL ELECTROLYTE AND METHODS OF PREPARING THE SAME

CROSS-REFERENCE TO RELATED APPLICATION

This application claims the benefit under 35 USC 119(a) of Korean Patent Application No. 10-2016-0014778 filed on Feb. 5, 2016, in the Korean Intellectual Property Office, the entire disclosure of which is incorporated herein by reference for all purposes.

TECHNICAL FIELD

The present disclosure relates to a dye-sensitized solar cell including a polymer/graphene composite gel electrolyte and methods of preparing the dye-sensitized solar cell.

BACKGROUND

Dye-sensitized solar cells (DSCs) are promising photovoltaic devices due to high photoelectric conversion efficiency ($\eta$), low manufacturing cost, and potential for manufacturing transparent devices. In a typical dye-sensitized solar cell, a liquid electrolyte (LE) is used as a hole-transport medium. However, leakage and evaporation of the liquid solvent occurs, so that the device efficiency is decreased over time. In order to overcome these problems, a lot of research has suggested substitution of the liquid electrolyte by solid or quasi-solid electrolytes including polymers, p-type semiconductors, hole-transport polymers, and solvent-free ionic liquids. Among these materials, the polymer-based solid electrolytes are competitive in terms of cost and processing. The hole-transport materials have not yet been commercialized. The polymer-based electrolytes are very suitable for manufacturing flexible devices. Various polymers including polyethylene oxide (PEO), poly(vinylidene fluoride-co-hexafluoropropylene), poly(methyl methacrylate) (PMMA), poly(acrylonitrile-co-vinyl acetate), and polyacrylonitrile have been applied to the dye-sensitized solar cells. In a polymer gel electrolyte (PEG), a polymer fixes solvent molecules with van der Waals forces and thus dramatically reduces the amount of usable solvent. The polymer gel electrolyte is often combined with nanoparticle fillers including $SiO_2$, $TiO_2$, and various carbon nanomaterials [e.g., carbon nanotube (CNT), graphene]. The nanoparticle fillers compensate low diffusibility of electrolyte ions and low conductivity of the polymer gel electrolyte film in the polymer matrix. To be more specific, a carbon nanomaterial tends to improve conductivity and dissociation due to its high adsorption of lithium ions. For example, a PEO/CNT complex showed ion diffusibility three times higher than PEO and a PMMA/CNT complex showed conductivity three times higher than bare PMMA.

However, the above-described application of the polymer gel electrolyte to the dye-sensitized solar cell produces some practical problems. When a typical dye-sensitized solar cell is prepared, the electrolytic solution is injected into a gap between a photoelectrode and a counter electrode during a final step of cell assembly. The gap generally has a width of ten of micrometers. Therefore, the injection of the polymer gel electrolyte with a high viscosity requires a high pressure which may affect the cell. Completely injecting the polymer gel electrolyte between mesoscale pores in a typical $TiO_2$ photo-absorption electrode film is also challenging. In this case, most of research on a polymer gel electrolyte in a dye-sensitized solar cell has used very low wt % of a polymer in order to produce a diluted polymer gel electrolyte. There has been an attempt to control a gelation rate of a polymer-dissolved liquid electrolyte in order to facilitate injection of a polymer gel electrolyte. Recently, a novel strategy based on in-situ gelation using a polymer/particle-deposited substrate has been suggested. In this approach, a polymer gel electrolyte was prepared by depositing polymer particles on the electrode, assembling the cell, and injecting an electrolyte solution to dissolve the polymer particles. After the cell was assembled, the polymer gel electrolyte was prepared. Thus, the above-described problems associated with injection and filling of ex-situ prepared polymer gel electrolyte were eliminated. However, the previous approach was verified using only polystyrene particles which have a relatively low compatibility with an acetonitrile-based electrolyte solvent. Therefore, in the in-situ approach suggested above, the use of polymer particles with a high compatibility is still challenging.

Korean Patent Laid-open Publication No. 10-2013-0145664 relates to a composite polymer electrolyte for rechargable lithium battery and a manufacturing method thereof, and discloses a polymer electrolyte in a solid state using a branched polymer and graphene oxide.

SUMMARY

In view of the foregoing, the present disclosure provides a dye-sensitized solar cell including a polymer/graphene composite gel electrolyte and methods of preparing the dye-sensitized solar cell.

However, problems to be solved by the present disclosure are not limited to the above-described problem. Although not described herein, other problems to be solved by the present disclosure can be clearly understood by those skilled in the art from the following descriptions.

In accordance with a first aspect of the present disclosure, there is provided a method of preparing a dye-sensitized solar cell including: forming a polymer particle layer on a counter electrode; coating the polymer particle layer with graphene flakes; and injecting an electrolytic solution into a gap between the counter electrode and a photoelectrode for in-situ gelation of the polymer particle layer by a solvent included in the electrolytic solution to form a polymer matrix and simultaneously to disperse the graphene flakes in the polymer matrix so as to form a polymer/graphene composite gel electrolyte.

In accordance with a second aspect of the present disclosure, there is provided a dye-sensitized solar cell including a polymer/graphene composite gel electrolyte containing graphene flakes dispersed in a polymer matrix, and the polymer/graphene composite gel electrolyte is prepared by forming the polymer matrix via in-situ gelation of a polymer particle layer previously coated on a counter electrode and simultaneously dispersing the graphene flakes previously coated on the polymer particle layer in the polymer matrix, by means of a solvent included in an electrolytic solution injected into a gap between the counter electrode and a photoelectrode included in the dye-sensitized solar cell.

In accordance with an embodiment of the present disclosure, polymer particles with an excellent compatibility with an electrolytic solution, particularly a solvent included in the electrolytic solution, and graphene flakes are coated on a counter electrode and an electrolyte is injected into a gap between the counter electrode and a photoelectrode, so that it is possible to prepare a dye-sensitized solar cell including a high-concentration polymer/graphene composite gel electrolyte in which a polymer matrix is formed by gelation of the polymer particle layer and the graphene flakes are dispersed on the gelated polymer matrix at the same time.

The polymer/graphene composite gel electrolyte of the dye-sensitized solar cell in accordance with an embodiment of the present disclosure is increased in ion diffusibility and conductivity due to addition of graphene and thus achieves a photoelectric conversion efficiency equivalent to that of a conventional liquid electrolyte. Therefore, the polymer/graphene composite gel electrolyte can be applied to energy devices, such as lithium batteries and capacitors, requiring a stable electrolyte system. Further, the dye-sensitized solar cell in accordance with an embodiment of the present disclosure has the advantage of being able to solve problems such as a decrease in efficiency caused by incomplete injection of a polymer gel electrolyte into pores of an electrode due to a high viscosity of the polymer gel electrolyte when the polymer gel electrolyte is injected during a preparing process of a conventional dye-sensitized solar cell.

DETAILED DESCRIPTION

Figure 1:
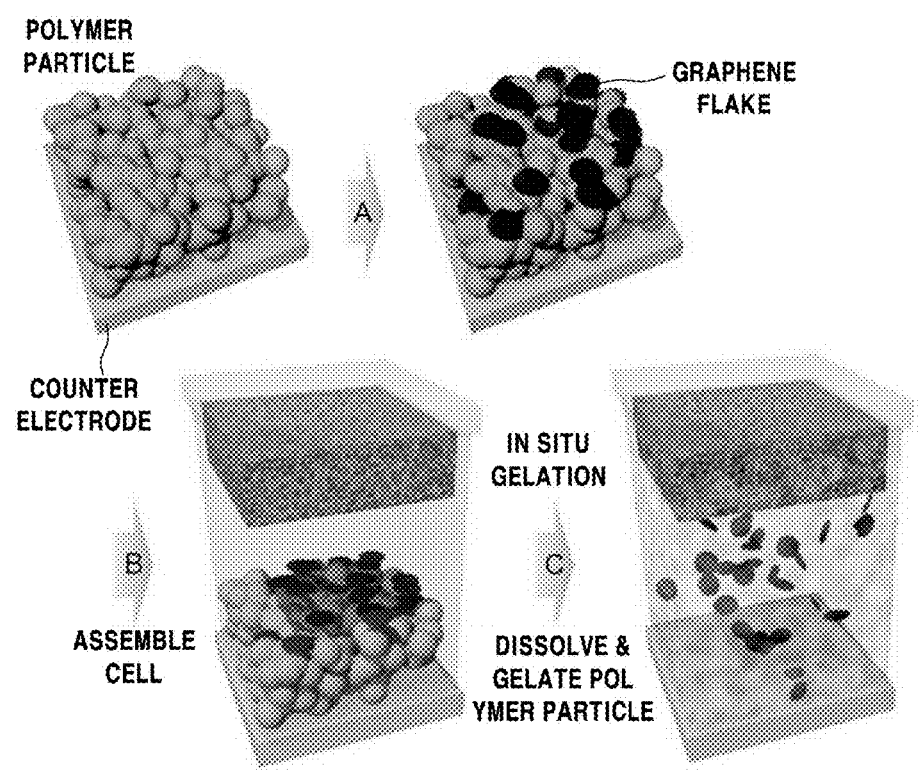
FIG. 1 is a schematic diagram illustrating in-situ formation of PMMA and a PMMA/graphene composite gel electrolyte in an embodiment of the present disclosure.

Hereinafter, examples of the present disclosure will be described in detail with reference to the accompanying drawings so that the present disclosure may be readily implemented by those skilled in the art. However, it is to be noted that the present disclosure is not limited to the examples but can be embodied in various other ways. In drawings, parts irrelevant to the description are omitted for simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically or electrostatically connected or coupled to" another element via still another element.

Through the whole document, the term "on" that is used to designate a position of one element with respect to another element includes both a case that the one element is adjacent to the another element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise. Through the whole document, the term "about or approximately" or "substantially" are intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "graphene" refers to a material forming a polycyclic aromatic molecule with multiple carbon atoms covalently bonded to each other. The covalently bonded carbon atoms form a six-member ring as a repeating unit, but can further include a five-member ring and/or a seven-member ring. Therefore, a sheet formed of the graphene may be seen as a single layer of carbon atoms covalently bonded to each other, but may not be limited thereto. The sheet formed of the graphene may have various structures depending on a content of five-member ring and/or a seven-member ring which may be contained in the graphene. Further, if the sheet formed of the graphene is formed into a single layer, such a single layer may be stacked to form multiple layers and a side end portion of the graphene sheet may be saturated with a hydrogen atom, but may not be limited thereto.

Through the whole document, the term "graphene oxide" may be abbreviated as "GO", and may include a structure in which a functional group containing oxygen such as a carboxyl group, a hydroxyl group, or an epoxy group is bonded to a single layer of graphene, but may not be limited thereto.

Through the whole document, the term "reduced graphene oxide" refers to graphene oxide decreased in a percentage of oxygen through a reduction process and may be abbreviated as "rGO", but may not be limited thereto.

Hereinafter, embodiments and examples of the present disclosure will be described in detail with reference to the accompanying drawings. However, the present disclosure may not be limited to the following embodiments and examples.

In accordance with a first aspect of the present disclosure, there is provided a method of preparing a dye-sensitized solar cell including: forming a polymer particle layer on a counter electrode; coating the polymer particle layer with graphene flakes; and injecting an electrolytic solution into a gap between the counter electrode and a photoelectrode for in-situ gelation of the polymer particle layer by a solvent included in the electrolytic solution to form a polymer matrix and simultaneously dispersing the graphene flakes in the polymer matrix so as to form a polymer/graphene composite gel electrolyte.

In an embodiment of the present disclosure, the polymer particle layer may be in-situ gelated by a solvent included in the electrolytic solution, so that the polymer matrix may be formed, but may not be limited thereto. FIG. 1 schematically illustrates a preparing process of a dye-sensitized solar cell including a polymer/graphene composite gel electrolyte in accordance with an embodiment of the present disclosure.

As illustrated in FIG. 1, a dye-sensitized solar cell includes a counter electrode, a polymer particle layer formed on the counter electrode, graphene flakes coated on the polymer particle layer, and a photoelectrode. In the above-described first process as illustrated in FIG. 1, polymer spherical particles are coated on the counter electrode, so that the polymer particle layer is formed. The graphene flakes are coated on the formed polymer particle layer (step A), and the counter electrode coated with the polymer particles and the graphene flakes is combined with the photoelectrode, so that a gap is formed (step B). When the dye-sensitized solar cell is assembled as shown in the step B, an electrolytic solution is injected into the gap between the counter electrode and the photoelectrode and thus gelates the polymer particles. Thus, a polymer matrix is formed and the graphene flakes are dispersed in the polymer matrix at the same time, so that a transparent polymer/graphene composite gel electrolyte is formed by in-situ gelation (step C).

In an embodiment of the present disclosure, the polymer may use a polymer which has been used in a conventional gel electrolyte, and particularly, any polymer which has an excellent affinity or compatibility with a solvent or a mixed solution of an electrolyte used in a dye-sensitized solar cell and is easy to be formed into nanoparticles may be used without particular limitation.

In an embodiment of the present disclosure, the polymer may include a conductive polymer and/or a non-conductive polymer. For example, the polymer may include a member selected from the group consisting of poly(methyl methacrylate) (PMMA), polyvinylidene fluoride (PVDF), polyethylene oxide (PEO), polyurethane (PU), polyacrylonitrile, polyacrylamide, polyvinyl acetate, polyvinyl pyrrolidinone, polytetraethylene glycol diacrylate, polystyrene (PS), and combinations thereof, but may not be limited thereto.

In an embodiment of the present disclosure, a method of forming the polymer particle layer is not particularly limited, and the polymer particle layer may be coated on the counter electrode by, for example, dip-coating or spin-coating, but the present disclosure may not be limited thereto.

In an embodiment of the present disclosure, a method of coating the graphene flakes is not particularly limited, and the graphene flakes may be coated on the polymer particle layer by, for example, electrospray, but the present disclosure may not be limited thereto.

In an embodiment of the present disclosure, the solvent included in the electrolytic solution may include an organic solvent, but may not be limited thereto. For example, the organic solvent may be used without limitation as long as it can cause in-situ gelation through gelation of the polymer particles and dispersion of the graphene flakes, and may include a nitrile-based solvent, but may not be limited thereto.

In an embodiment of the present disclosure, the nitrile-based solvent may include a member selected from the group consisting of acetonitrile, 3-methoxypropionitrile, propionitrile, butyronitrile, t-butyl cyanide, valeronitrile, caprylonitrile, heptanenitrile, cyclopentane carbonitrile, cyclohexane carbonitrile, 2-fluorobenzonitrile, 4-fluorobenzonitrile, difluorobenzonitrile, trifluorobenzonitrile, 2-chlorobenzonitrile, 4-chlorobenzonitrile, dichlorobenzonitrile, trichlorobenzonitrile, 2-chloro-4-fluorobenzonitrile, 4-chloro-2-fluorobenzonitrile, phenylacetonitrile, 2-fluorophenylacetonitrile, 4-fluorophenylacetonitrile, and combinations thereof, but may not be limited thereto.

In an embodiment of the present disclosure, the organic solvent may include acetonitrile, valeronitrile, or a mixture thereof, but may not be limited thereto.

In an embodiment of the present disclosure, the organic solvent may highly dissolve ions favorable for electron transport. For example, the organic solvent may highly disperse the polymer (particles) included in the electrode of the dye-sensitized solar cell and gelate the polymer (particles), but may not be limited thereto.

In an embodiment of the present disclosure, a solubility of the polymers may vary depending on the kind of the organic solvent and/or compatibility with the organic solvent, but may not be limited thereto. For example, if the polymer particles are poly(methyl methacrylate) (PMMA) and the organic solvent is a mixture of acetonitrile and valeronitrile, as the content of the valeronitrile in the organic solvent is increased, dispersion and gelation of the PMMA particles may occur more quickly, but the present disclosure may not be limited thereto.

In an embodiment of the present disclosure, a minimum polymer content required for gelation of the polymer gel electrolyte may vary depending on the kind of the organic solvent, but may not be limited thereto.

In an embodiment of the present disclosure, a content of the polymer matrix may be about 20 parts by weight or less with respect to 100 parts by weight of the polymer/graphene composite gel electrolyte, but may not be limited thereto. For example, the content of the polymer matrix may be about 20 parts by weight or less, from about 1 to about 20 parts by weight, from about 1 to about 15 parts by weight, from about 1 to about 10 parts by weight, from about 5 to about 20 parts by weight, from about 5 to about 15 parts by weight, from about 5 to about 10 parts by weight, from about 10 to about 20 parts by weight, from about 10 to about 15 parts by weight, or from about 15 to about 20 parts by weight with respect to 100 parts by weight of the polymer/graphene composite gel electrolyte, but may not be limited thereto.

In an embodiment of the present disclosure, a content of the graphene flakes may be about 10 parts by weight or less with respect to 100 parts by weight of the polymer/graphene composite gel electrolyte, but may not be limited thereto. For example, the content of the graphene flakes may be about 10 parts by weight or less, from about 0.1 to about 10 parts by weight, from about 0.1 to about 8 parts by weight, from about 0.1 to about 6 parts by weight, from about 0.1 to about 4 parts by weight, from about 0.1 to about 2 parts by weight, from about 0.1 to about 1 parts by weight, from about 1 to about 10 parts by weight, from about 1 to about 8 parts by weight, from about 1 to about 6 parts by weight, from about 1 to about 4 parts by weight, from about 1 to about 2 parts by weight, from about 2 to about 10 parts by weight, from about 2 to about 8 parts by weight, from about 2 to about 6 parts by weight, from about 2 to about 4 parts by weight, from about 4 to about 10 parts by weight, from about 4 to about 8 parts by weight, from about 4 to about 6 parts by weight, or from about 8 to about 10 parts by weight with respect to 100 parts by weight of the polymer/graphene composite gel electrolyte, but may not be limited thereto.

In accordance with a second aspect of the present disclosure, there is provided a dye-sensitized solar cell including a polymer/graphene composite gel electrolyte containing graphene flakes dispersed in a polymer matrix, wherein the polymer/graphene composite gel electrolyte is, prepared by forming the polymer matrix via in-situ gelation of a polymer particle layer previously coated on a counter electrode and simultaneously dispersing the graphene flakes previously coated on the polymer particle layer in the polymer matrix, by means of a solvent included in an electrolytic solution injected into a gap between the counter electrode and a photoelectrode included in the dye-sensitized solar cell.

In an embodiment of the present disclosure, the dye-sensitized solar cell may be prepared by the method in accordance with the first aspect of the present disclosure, but may not be limited thereto. Detailed descriptions of the dye-sensitized solar cell in accordance with the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

In an embodiment of the present disclosure, the polymer particle layer may be gelated by the solvent included in the electrolytic solution, so that the polymer matrix may be formed, but the present disclosure may not be limited thereto.

In an embodiment of the present disclosure, the polymer may use a polymer which has been used in a conventional gel electrolyte, and particularly, any polymer which has an excellent affinity or compatibility with a solvent or a mixed solution of an electrolyte used in a dye-sensitized solar cell and is easy to be formed into nanoparticles may be used without particular limitation.

In an embodiment of the present disclosure, the polymer may include a conductive polymer and/or a non-conductive polymer. For example, the polymer may include a member selected from the group consisting of poly(methyl methacrylate) (PMMA), polyvinylidene fluoride (PVDF), polyethylene oxide (PEO), polyurethane (PU), polyacrylonitrile, polyacrylamide, polyvinyl acetate, polyvinyl pyrrolidinone, polytetraethylene glycol diacrylate, polystyrene (PS), and combinations thereof, but may not be limited thereto.

In an embodiment of the present disclosure, the solvent included in the electrolytic solution may include an organic solvent, but may not be limited thereto. For example, the organic solvent may be used without limitation as long as it can cause in-situ gelation through gelation of the polymer particles and dispersion of the graphene flakes, and may include a nitrile-based solvent, but may not be limited thereto.

In an embodiment of the present disclosure, the nitrile-based solvent may include a member selected from the group consisting of acetonitrile, 3-methoxypropionitrile, propionitrile, butyronitrile, t-butyl cyanide, valeronitrile, caprylonitrile, heptanenitrile, cyclopentane carbonitrile, cyclohexane carbonitrile, 2-fluorobenzonitrile, 4-fluorobenzonitrile, difluorobenzonitrile, trifluorobenzonitrile, 2-chlorobenzonitrile, 4-chlorobenzonitrile, dichlorobenzonitrile, trichlorobenzonitrile, 2-chloro-4-fluorobenzonitrile, 4-chloro-2-fluorobenzonitrile, phenylacetonitrile, 2-fluorophenylacetonitrile, 4-fluorophenylacetonitrile, and combinations thereof, but may not be limited thereto.

In an embodiment of the present disclosure, the organic solvent may include acetonitrile, valeronitrile, or a mixture thereof, but may not be limited thereto.

In an embodiment of the present disclosure, the organic solvent may highly dissolve ions favorable for electron transport. For example, the organic solvent may highly disperse the polymer particles included in the electrode of the dye-sensitized solar cell and gelate the polymer particles, but the present disclosure may not be limited thereto.

In an embodiment of the present disclosure, a solubility of the polymers may vary depending on the kind of the organic solvent and/or compatibility with the organic solvent, but may not be limited thereto. For example, if the polymer particles are poly(methyl methacrylate) (PMMA) and the organic solvent is a mixture of acetonitrile and valeronitrile, as the content of the valeronitrile in the organic solvent is increased, dispersion and gelation of the PMMA particles may occur more quickly, but the present disclosure may not be limited thereto.

In an embodiment of the present disclosure, a minimum polymer content required for gelation of the polymer gel electrolyte may vary depending on the kind of the organic solvent, but may not be limited thereto.

In an embodiment of the present disclosure, the dye-sensitized solar cell may solve problems such as a decrease in efficiency caused by incomplete injection of a polymer gel electrolyte into pores of an electrode due to a high viscosity of the polymer gel electrolyte when the polymer gel electrolyte is injected during a preparing process of a conventional dye-sensitized solar cell, but may not be limited thereto.

Hereinafter, the present disclosure will be explained in more detail with reference to Examples. However, the following Examples are illustrative only for better understanding of the present disclosure but do not limit the present disclosure.

EXAMPLES

Preparation of poly(methyl methacrylate) (PMMA) Particle and Graphene Composite Layer PMMA spherical particles were synthesized by emulsion polymerization. The polymerization was performed using a 14 wt % MMA monomer, a 0.3 wt % (with respect to the weight of the monomer) 2,2'-azobis(2-methylpropionamidine) initiator, and deionized water for 24 hours at 70° C. The particles were purified by several times of sedimentation in water, centrifugation, and dispersion. The PMMA spheres were coated on a Pt-coated transparent electrode serving as a counter electrode by dip-coating. The Pt-coated transparent electrode was prepared by coating a 0.7 mM $H_2PtCl_6$ solution in anhydrous ethanol on a FTO substrate. Graphene flake powder (Angstron Materials) with an oxygen content of about 1.5% was dispersed in isopropyl alcohol and produced to 0.3 wt % in a graphene-dispersed solution. The graphene-dispersed solution was electro-sprayed on the PMMA spheres (spherical particles). A voltage of 2.0 kV was applied from a spray nozzle using acceleration of 24 G, and a feed flow rate was about 30 $\mu m \cdot min^{-1}$.

Assembly of Dye-Sensitized Solar Cell

A conventional nanocrystalline $TiO_2$ photoelectrode film was prepared by doctor blade coating. The area of the $TiO_2$ nanoparticle (NP) film was adjusted to be about 8 to about 10 $mm^2$ by scraping. The $TiO_2$ film was immersed in a 0.5 mM D205 solution in acetonitrile all through the night and sensitized with a D205 dye (Mitsubishi Paper Mills). A Pt counter electrode was prepared by coating a 0.7 mM $H_2PtCl_6$ solution in anhydrous ethanol on a FTO substrate. The $TiO_2$ NP-coated FTO substrate and the counter electrode were assembled, and a gap between the two electrodes was fixed using a 60 µm-thickness polymer film (Surlyn, DuPont). Finally, an electrolytic solution was injected into the gap. The electrolytic solution was prepared by mixing a 0.05 M LiI (Sigma-Aldrich), a 0.1 M guanidine thiocyanate (Wako), a 0.03 M $I_2$ (Yakuri), a 0.5 M 4-tert-butylpyridine (Aldrich), and a 0.7 M 1-butyl-3-methylimidazolium iodide (BMII) (Sigma-Aldrich) in a solution containing acetonitrile (Aldrich) and valeronitrile (85:15 v/v).

Analysis of Characteristics

The diffusibility of the polymer gel electrolyte was measured by cyclic voltammetry (Versatat, Ametek), and the conductivity was measured using impedance spectroscopy (Versatat, Ametek). In order to measure them, a cell including two Pt-coated FTO electrodes containing the polymer gel electrolyte between the two electrodes was prepared. The SEM images were obtained using a field-emission scanning electron microscope) (Hitachi S-4700). The Raman spectrum was recorded at an excitation wavelength of 487.55 nm using Micro-Raman spectroscopy (Tokyo Instruments, Nanofinder). The J-V characteristic of the dye-sensitized solar cell was measured using a source meter (Keithley Instruments) under simulated solar light provided by a solar simulator (1000 W Xe lamp with AM 1.5 G filter). The light intensity was adjusted to 100 mWcm$^{-2}$ using a Si reference cell (BS-520, Bunko-Keiki). The electrochemical impedance of the dye-sensitized solar cell was analyzed by impedance spectroscopy using an impedance spectrometer (Versastat, AMETEK). The measurements were carried out at a frequency range of from 10$^5$ to 0.1 Hz with a perturbation amplitude of 10 mV under darkness or 1-sun illumination conditions. The data were fitted by an equivalent circuit provided by Z-View software (Scribner Associates, Inc.).

Referring to FIG. 1, in the present Example, preparation of a PMMA/graphene in situ-dye-sensitized solar cell (i-PGE) was described. The PMMA spherical particles were deposited on the Pt-coated FTO counter electrode, and the graphene flakes were deposited on the PMMA sphere layer (step A). The PMMA/graphene-coated FTO substrate was inserted between $TiO_2$ photoelectrodes. The electrolytic solution was injected into the gap between the photoelectrode and the PMMA/graphene counter electrode (step B). As illustrated in FIG. 1, the cell became transparent. It was observed that this was caused by the gelation of PMMA in the electrolytic solution and the dispersion of the graphene flakes (step C). The thickness of the PMMA sphere layer was adjusted to 2 µm and produced about 12 wt % PMMA gel solution. Complete gelation of the PMMA particle-containing electrolytic solution was confirmed by increasing the volume of the electrolytic solution. The optimum wt % of graphene was determined by continuous comparison of the graphene content with the efficiency of a dye-sensitized solar cell using the i-PGE composite. The 0.3 wt % graphene-based i-PGE dye-sensitized solar cell showed the highest efficiency as compared with the 0.1 wt % and 0.6 wt % graphene samples.

Figure 2A:
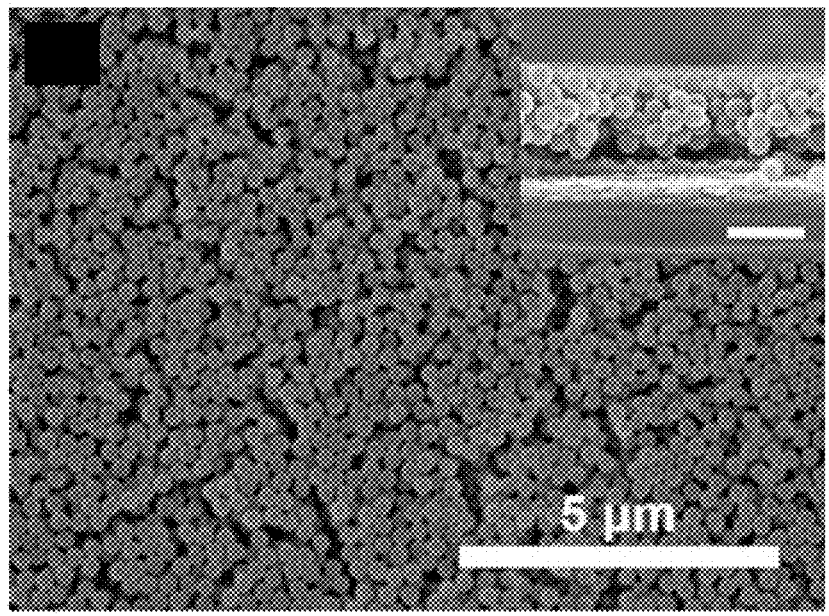
FIG. 2A and FIG. 2B are surface SEM images of (A) a PMMA spherical particle layer and (B) a PMMA/graphene composite layer (B) in an example of the present disclosure.
Figure 2B:
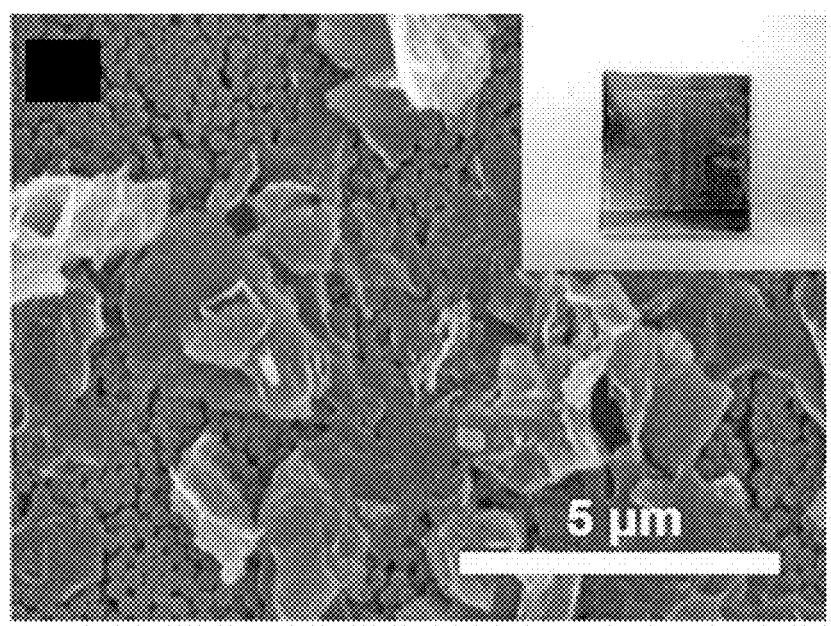

The SEM image of the PMMA particle layer was characterized by 250 nm-diameter PMMA spherical assemblies (FIG. 2A). The thickness of the PMMA layer was about 1.8 µm as shown in the insert view of FIG. 2A. The PMMA/graphene composite layer showed dispersion of the graphene flakes with respect to the area of about 5×5 µm on the PMMA surface (FIG. 2B). The digital image of the composite layer was shown by gray-scale on the basis of the presence of graphene in the insert view of FIG. 2B.

Figure 3A:
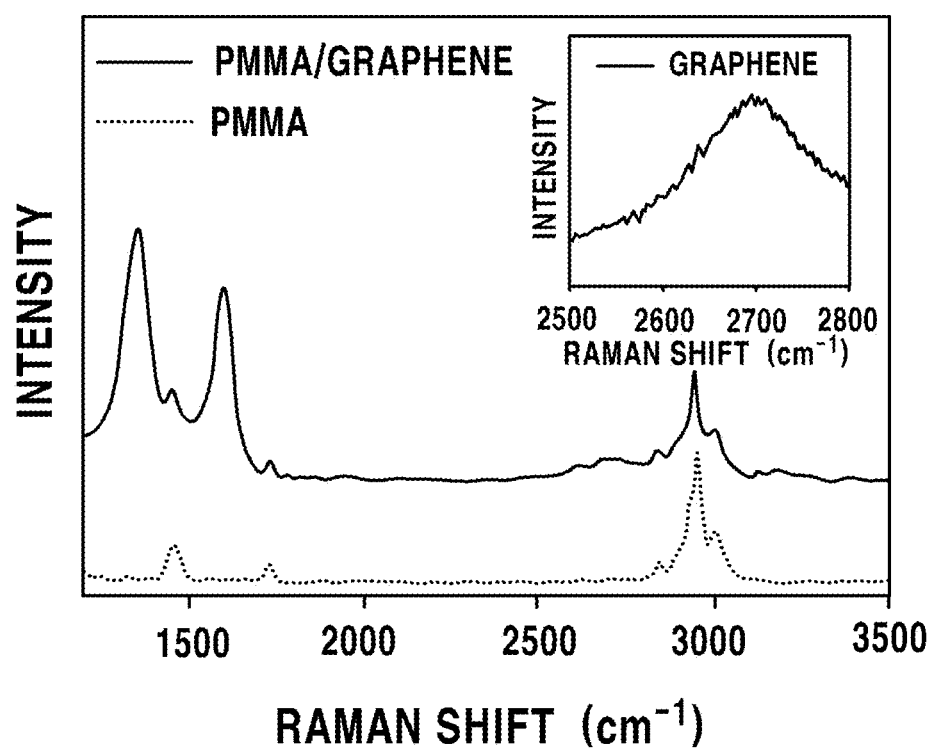
FIG. 3A and FIG. 3B are graphs showing (A) a Raman spectrum of PMMA and a PMMA/graphene film and (B) an XPS C1s spectrum of graphene powder in an example of the present disclosure.
Figure 3B:
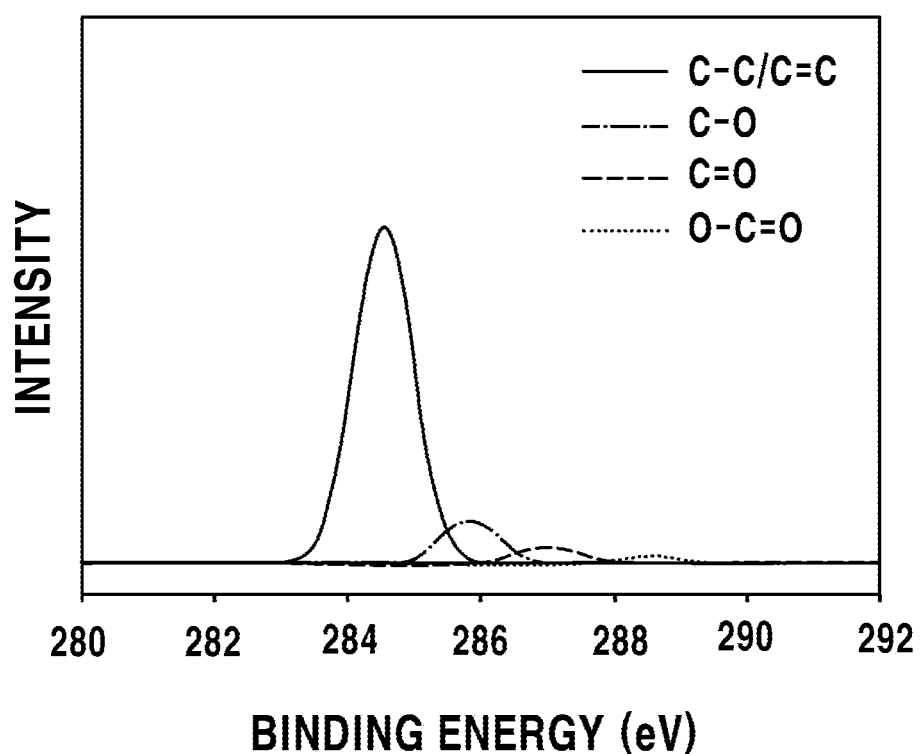

The PMMA and PMMA/graphene film were also characterized suing the Raman spectrum. As shown in FIG. 3, strong peaks at 1460 cm$^1$, 1740 cm$^1$, and 2950 cm$^1$ respectively corresponded to C–H bending, C=C/C—COO stretching, and ester-$CH_3$ stretching of $\alpha$-$CH_3$ in the PMMA molecules. In the PMMA/graphene composite film, additional strong peaks at 1360 cm$^1$ and 1590 cm$^1$ were as shown in FIG. 3. These peaks are characteristics of carbon. The former is relevant to disorder or edge defect of in-plane graphite (i.e., D-band), and the latter is relevant to in-plane $sp^2$ carbon vibration of graphite (i.e., G-band). The intensity ratio ($I_D/I_G$) of the D- and G-bands was about 1.3. The ratio of reduced graphene oxide obtained by chemical approaches were often 1.0 or more. Therefore, the graphene flakes were assumed to have characteristics of reduced graphene oxide. The 2D-band was also observed around 2700 cm$^1$. The intensity of the 2D-band was relatively weaker than that of the G-band, and the 2D-band showed a smaller splitting. This result may mean dispersion of a multilayer graphene.

The graphene flakes were also characterized using XPS. In the XPS spectrum, a C1s peak was explained by four different peaks at 284.6 eV for C—C/C=C bond, 285.9 eV for C—O, 287.1 eV for C=O, and 288.6 eV for O—C=O. In consideration of relative contents of the functional groups, the graphene flake powder has a high ratio of C—C/C=C bond as compared with other oxygenated groups, which confirms the presence of high-quality graphene.

In the bare PMMA and PMMA/graphene i-PGE, ion diffusion coefficients were measured using a saturation current at which the ion diffusion is restricted within the electrolyte. A diffusion coefficient of the liquid electrolyte (LE) was also measured for comparison. Since I$^-$ was dominant in the liquid electrolyte, the limiting current was determined by I$^{3-}$ ions. Fick's First Law, i.e., J=2nFCD/I, was applied to ion diffusion. Herein, J represents a saturation current, n represents the number of electrons transferred during the reaction (i.e., reduction of I$^{3-}$, so n=2), F represents Faraday constant, C represents a bulk concentration of the I$^{3-}$ ions, D represents a diffusion coefficient of the I$^{3-}$ ions, and I represents the thickness of the electrolyte layer. Table 1 shows the ion-diffusion coefficient and the ionic conductivity in the LE (liquid electrolyte), PMMA i-PGE (PMMA-based in situ-polymer gel electrolyte), and PMMA/graphene i-PGE. The diffusion coefficient of the PMMA i-PGE was ⅓ of the diffusion coefficient of the LE as shown in the following Table 1. The use of PMMA caused an increase in viscosity of the electrolyte and thus restricted ion mobility. The addition of a graphene filler caused an increase in diffusion coefficient by about 20% as compared with the PMMA i-PGE, which is also shown in Table 1. It has been reported that a carbonaceous filler causes improvement in ion dissociation of LiI and thus maintains a high concentration of electrolyte ions. Such an effect caused an increase in apparent diffusion coefficient.

TABLE 1

| Electrolyte type | Diffusion coefficient ($cm^2S^{-1}$) | Ionic conductivity ($Scm^{-1}$) |
|---|---|---|
| Liquid electrolyte | 13.7 × 10$^{-6}$ | — |
| PMMA | 4.21 × 10$^{-6}$ | 0.86 × 10$^{-3}$ |
| PMMA/graphene | 5.20 × 10$^{-6}$ | 1.26 × 10$^{-3}$ |

The conductivity of the LE, bare PMMA i-PGE, and PMMA/graphene i-PGE film was calculated using the equation $\sigma=L/R_bA$. Herein, $\sigma$ represents the conductivity, L and A respectively represent the thickness and the area of the film, and $R_b$ represents a bulk resistance measured from the impedance plot. The PMMA i-PGE film was shown as having a lower conductivity than the LE (Table 1). The measured conductivity of the PMMA i-PGE was slightly lower than those of conventional PMMA PGEs in the range of 1 to 3 mScm$^{-1}$. Such a discovery may be the result of a higher concentration (10 wt %) of PMMA in the i-PGE as compared with those, i.e., generally 5 wt % or less, used in other studies. The PMMA/graphene PMMA i-PGE showed a higher conductivity than the PMMA i-PGE. An increase in conductivity in the polymer film, such as carbon nanotube and graphene, caused by addition of a carbon material has been well researched. A carbon filler is known as providing a conducting pathway.

Figure 4:
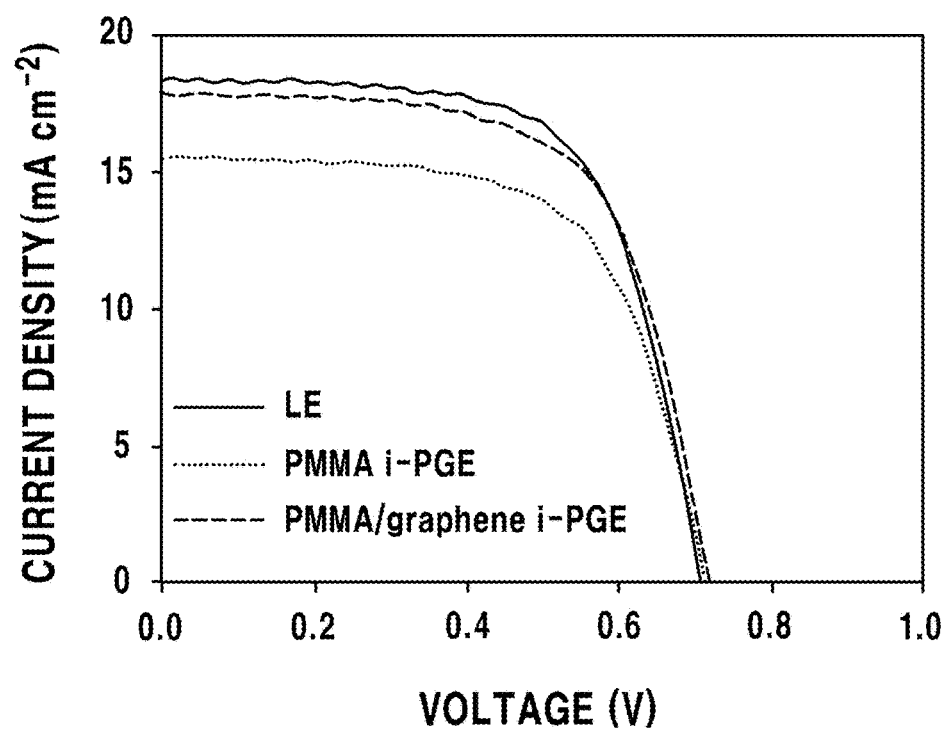
FIG. 4 is a graph showing J-V curves of dye-sensitized solar cells (DSCs) prepared using a LE (liquid electrolyte), a PMMA i-PGE (in situ-polymer gel electrolyte), and a PMMA/graphene i-PGE in an example of the present disclosure.

The photoelectric performance of the dye-sensitized solar cell containing PMMA and PMMA/graphene i-PGE was evaluated by measuring photocurrent density and voltage (J-V). The photoelectric characteristics of a dye-sensitized solar cell containing a liquid electrolyte (LE DSC) were also compared. A short-circuit current density ($J_{sc}$), an open-circuit voltage ($V_{oc}$), and a fill factor (FF) were extracted from FIG. 4 and the J-V profile as shown in the following Table 2. Table 2 shows the photoelectric parameters and photoelectric conversion efficiency of dye-sensitized solar cells prepared using the LE, PMMA i-PGE, and PMMA/graphene i-PGE. Based on these data, η was measured according to a relation formula, i.e., η=$J_{sc}$×$V_{oc}$×FF/(100 mWcm$^{-2}$). The PMMA i-PGE dye-sensitized solar cell showed a 7% lower $J_{sc}$ and a 10% lower FF than a dye-sensitized solar cell including the liquid electrolyte. This result can be explained by lower ion diffusion and conductivity caused by the presence of PMMA. The lower diffusion of $I^{3-}$ ions causes recombination of electrons and reduces $J_{sc}$, and the high series of resistance reduces FF. In comparison between the PMMA and PMMA/graphene i-PGE, the addition of graphene increases $J_{sc}$ and FF by 5% and 10%, respectively. This effect can also be explained by the fact that graphene improves ion diffusibility and conductivity of the PMMA-based i-PGE. It has been often reported that inorganic nanofillers such as $SiO_2$ and $TiO_2$ reduces the conductivity of this material. η of the PMMA-graphene i-PGE dye-sensitized solar cell is 8.49% which is lower only by 6% than that of the dye-sensitized solar cell containing a liquid electrolyte (LE DSC).

TABLE 2

| Electrolyte type | $J_{SC}$ (mAcm$^{-2}$) | $V_{OC}$ (V) | FF | η (%) |
|---|---|---|---|---|
| Liquid electrolyte | 19.22 | 0.71 | 0.63 | 8.60 |
| PMMA | 18.05 | 0.72 | 0.57 | 7.29 |
| PMMA/graphene | 18.45 | 0.72 | 0.64 | 8.49 |

Figure 5:
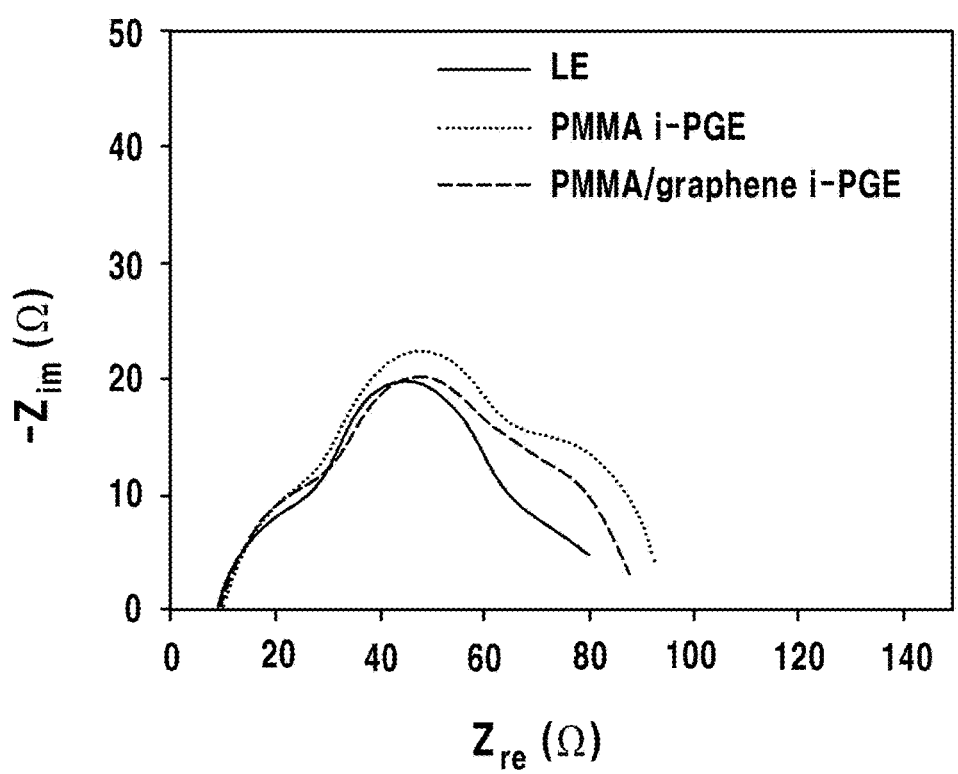
FIG. 5 is a Nyquist plot of dye-sensitized solar cells (DSCs) prepared using a LE, a PMMA i-PGE, and a PMMA/graphene i-PGE in an example of the present disclosure.
Figure 6A:
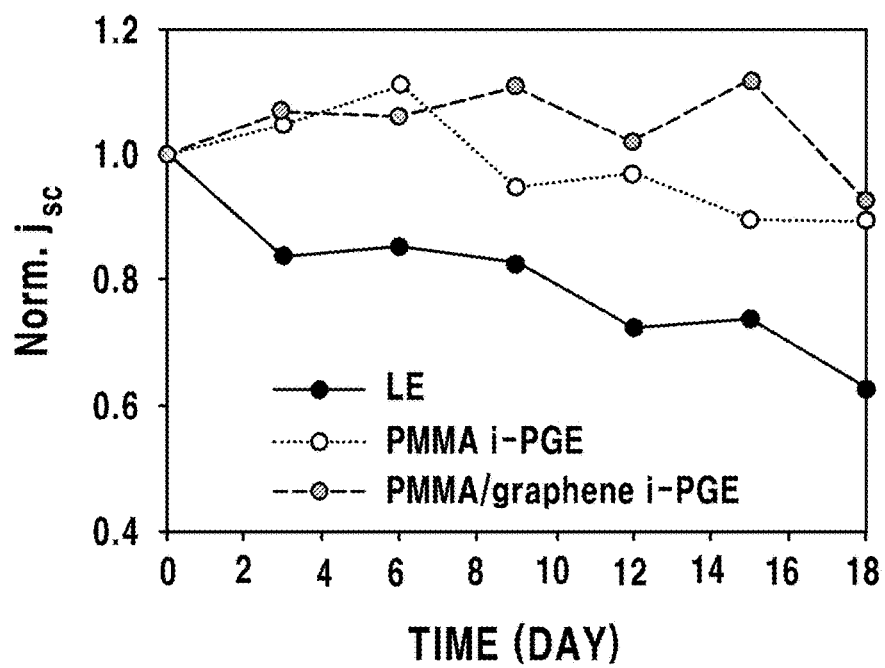
FIG. 6A to FIG. 6D are graphs showing normalized photoelectric parameters for dye-sensitized solar cells (DSCs) prepared using a LE, a PMMA i-PGE, and a PMMA/graphene i-PGE during a heat treatment at 60° C. in an example of the present disclosure.
Figure 6B:
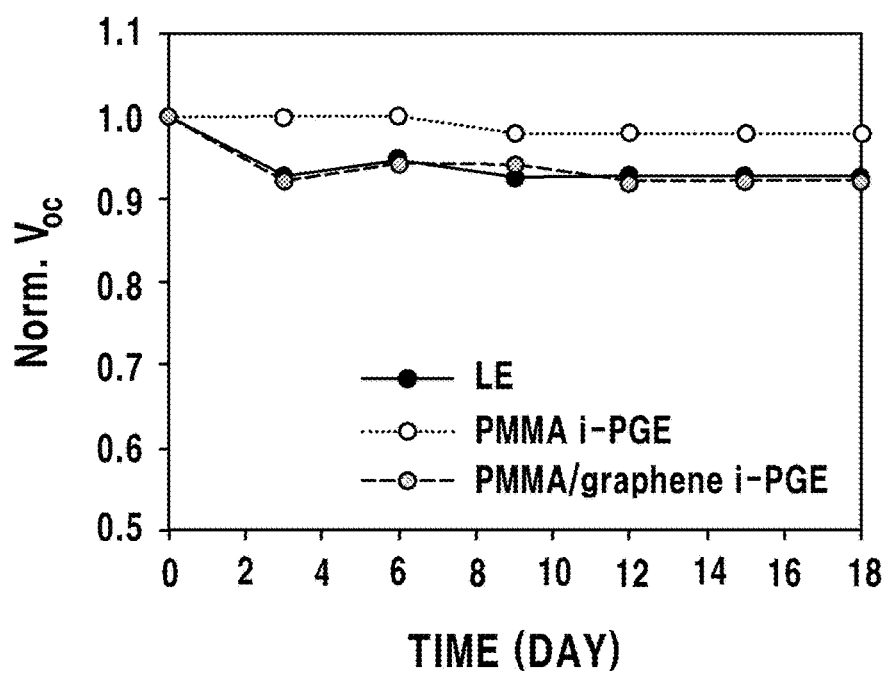
Figure 6C:
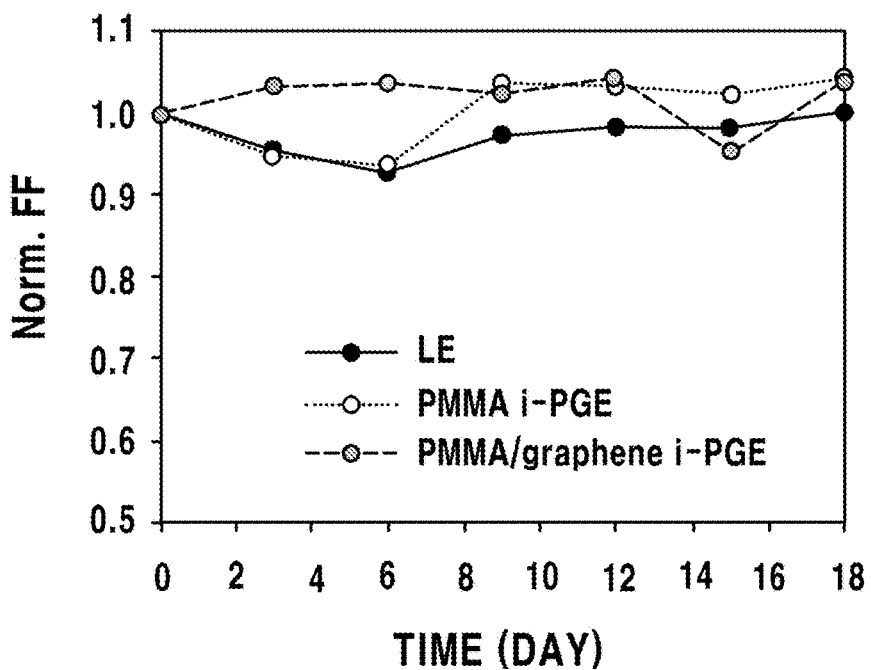
Figure 6D:
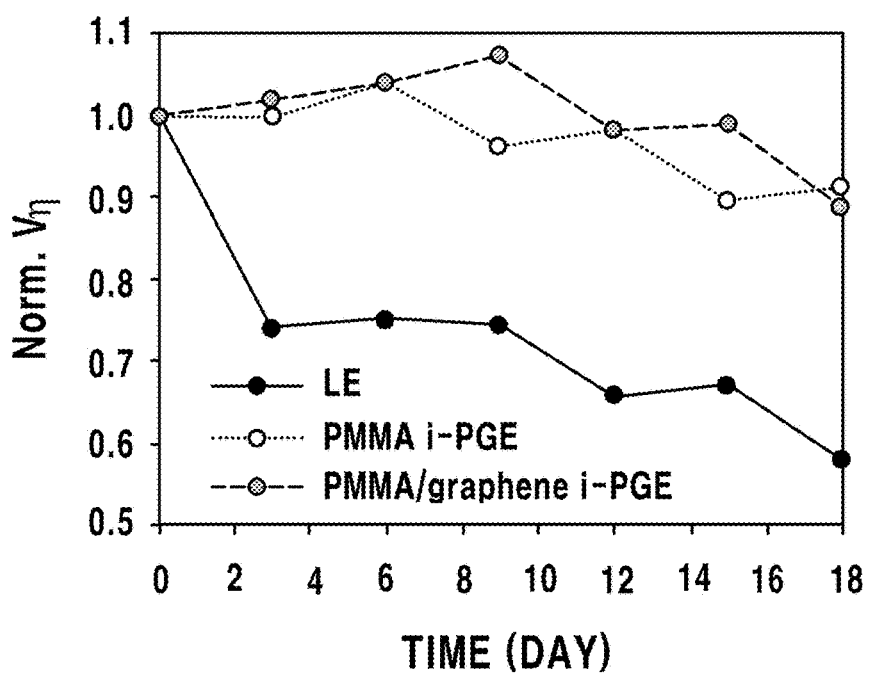

Electrochemical impedance spectra of the LE, PMMA i-PGE, and PMMA/graphene i-PGE dye-sensitized solar cells were characterized. The three semicircles from the left show a resistance (e.g., 10$^5$-30 Hz) relevant to an electrochemical reaction in a Pt-electrolyte interface ($R_1$), a resistance (e.g., 30$^{-1}$ Hz) relevant to an electrochemical reaction in a $TiO_2$-dye-electrolyte interface ($R_{ct}$), and an ion diffusion resistance (e.g., 1-10$^{-1}$ Hz) ($R_2$), as shown in FIG. 5. These resistances were obtained by fitting the plot to an equivalent circuit, and summarized in the following Table 3. Table 3 shows interfacial resistances of the dye-sensitized solar cells containing LE, PMMA i-PGE, and PMMA/graphene i-PGE calculated by adjusting the equivalent circuit. In the electrolytic solution, $R_1$ was not affected due to the presence of the PMMA and graphene; $R_2$ is increased in the LE according to addition of PMMA and also according to mixing of graphene. This corresponds to a change in diffusion coefficient. $R_{ct}$ of the PMMA i-PGE dye-sensitized solar cell was lower than that of the LE, which confirms that the lower diffusibility of the PMMA i-PGE adds a recombination speed, so that a lower $J_{sc}$ is obtained. In comparison between the PMMA and PMMA/graphene i-PGE, addition of graphene reduces recombination and thus recovers $J_{sc}$.

TABLE 3

| Electrolyte type | $R_1$ (Ω) | $R_{ct}$ (Ω) | $R_2$ (Ω) |
|---|---|---|---|
| Liquid electrolyte | 8.62 | 44.7 | 9.99 |
| PMMA | 9.43 | 36.0 | 21.0 |
| PMMA/graphene | 10.2 | 40.7 | 18.0 |

Finally, the long-term stability of the dye-sensitized solar cells prepared using the LE, PMMA i-PGE, and PMMA/graphene i-PGE were compared. The changes of J-V parameters ($J_{sc}$, $V_{oc}$, FF, and η) for an aging time normalized by initial values of the prepared dye-sensitized solar cells were as shown in FIG. 6. The dye-sensitized solar cells were exposed to thermal stress at 60° C. in a dark state. As a result, the LE cell showed a significant decrease by about 60% in η, whereas both of the two i-PGE dye-sensitized solar cells maintained η up to 90% of the initial values during the test period. In the dye-sensitized solar cell containing LE, the decrease in η was connected to a decrease in $J_{sc}$. A lot of research showed that leakage and evaporation of the electrolytic solution from the LE cell causes a decrease in $J_{sc}$; Therefore, similar to a conventional PGE system, the i-PGE effectively avoided the loss of an electrolyte solvent in order to maintain the performance.

In-situ formation of a poly(methyl methacrylate) (PMMA)-based polymer-gel electrolyte (PGE) and a graphene filler for use in a quasi-solid dye-sensitized solar cell was demonstrated. In the present disclosure, PMMA spherical particles and graphene flakes were deposited on the counter electrode, the dye-sensitized solar cell device was assembled, and the electrolytic solution was finally injected; The electrolytic solution dispersed and gelated the PMMA particles and dispersed the graphene, so that a gelated electrolyte was obtained. By changing the amounts of these materials used for forming a desired coating, the concentrations of the PMMA and the filler could be easily adjusted and the obtained concentration of the polymer gel electrolyte (PGE) was 10 wt % or more. The PMMA i-PGE showed lower ion diffusibility and conductivity than the liquid electrolyte (LE). Accordingly, lower short-circuit current density and fill factor (FF) were obtained from the PMMA i-PGE dye-sensitized solar cell. Formation of the PMMA/graphene filler composite i-PGE improves both of the diffusibility and conductivity of the material. The dye-sensitized solar cell using PMMA/graphene i-PGE showed a photoelectric conversion efficiency (η) similar to that of a dye-sensitized solar cell including a conventional liquid electrolyte. In the long-term stability test of the dye-sensitized solar cell under thermal immersion conditions, the dye-sensitized solar cell including a liquid electrolyte showed a remarkable decrease by about 60% in η, which may be the result of evaporation of the electrolyte solvent, during the test, whereas the PMMA/graphene i-PGE dye-sensitized solar cell maintained η up to 90%. It is confirmed that the above-suggested in-situ gelation method maintains a very stable device efficiency up to 90% of its initial value and alleviates the problems caused by injection of a polymer gel electrolyte during a preparing process of a conventional dye-sensitized solar cell. Accordingly, this method can be applied to other energy devices, such as lithium batteries and capacitors, requiring a stable electrolyte system.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method of preparing a dye-sensitized solar cell, comprising:
    forming a layer of particles of a polymer on a counter electrode, wherein the polymer includes a member selected from the group consisting of poly(methyl methacrylate) (PMMA), polyvinylidene fluoride (PVDF), polyethylene oxide (PEO), polyurethane (PU), polyacrylonitrile, polyacrylamide, polyvinyl acetate, polyvinyl pyrrolidinone, polytetraethylene glycol diacrylate, polystyrene (PS), and combinations thereof;
    coating the polymer particle layer with graphene flakes;
    positioning, after coating the polymer particle layer with graphene flakes, a photoelectrode next to the counter electrode to form a gap; and,
    injecting an electrolytic solution into the gap previously formed between the counter electrode and the photoelectrode for in-situ gelation of the polymer particle layer by a solvent included in the electrolytic solution to form a polymer matrix and simultaneously to disperse the graphene flakes in the polymer matrix so as to form a polymer/grapheme composite gel electrolyte.

2. The method of preparing a dye-sensitized solar cell of claim 1, wherein the polymer has compatibility with the solvent included in the electrolytic solution.

3. The method of preparing a dye-sensitized solar cell of claim 1, wherein the polymer includes a conductive polymer and/or a non-conductive polymer.

4. The method of preparing a dye-sensitized solar cell of claim 1, wherein the solvent included in the electrolytic solution includes an organic solvent.

5. The method of preparing a dye-sensitized solar cell of claim 1, wherein the polymer matrix comprises between 1 to 20 parts by weight with respect to 100 parts by weight of the polymer/graphene composite gel electrolyte.

6. The method of preparing a dye-sensitized solar cell of claim 1, wherein the graphene flakes comprise between 1 to 10 parts by weight with respect to 100 parts by weight of the polymer/graphene composite gel electrolyte.

7. The method of preparing a dye-sensitized solar cell of claim 1, wherein the layer of particles of the polymer is coated on the counter electrode by spin-coating or dip-coating.

8. The method of preparing a dye-sensitized solar cell of claim 1, wherein the graphene flakes are coated on the layer of particles of the polymer layer by electrospray.

* * * * *